(12) United States Patent
Choi

(10) Patent No.: US 10,571,496 B2
(45) Date of Patent: Feb. 25, 2020

(54) DEVICE OF MONITORING REACTIVE POWER COMPENSATION SYSTEM, AND METHOD THEREOF

(71) Applicant: LSIS CO., LTD., Gyeonggi-do (KR)

(72) Inventor: Yong-Kil Choi, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 280 days.

(21) Appl. No.: 15/606,484

(22) Filed: May 26, 2017

(65) Prior Publication Data

US 2018/0003747 A1 Jan. 4, 2018

(30) Foreign Application Priority Data

Jul. 4, 2016 (KR) .................. 10-2016-0084340

(51) Int. Cl.
| | | |
|---|---|---|
| *G01R 21/00* | (2006.01) | |
| *H02J 3/01* | (2006.01) | |
| *H02J 3/24* | (2006.01) | |
| *H02J 3/18* | (2006.01) | |
| *H02J 3/00* | (2006.01) | |

(52) U.S. Cl.
CPC ............ *G01R 21/003* (2013.01); *H02J 3/01* (2013.01); *H02J 3/18* (2013.01); *H02J 3/24* (2013.01); *H02J 2003/002* (2013.01)

(58) Field of Classification Search
CPC .. G01R 21/003; G01R 21/006; G01R 21/005; G01R 21/06; H02J 3/18; H02J 3/1807; H02J 3/1821
USPC ........................................................ 324/113
See application file for complete search history.

(56) References Cited

U.S. PATENT DOCUMENTS

| | | | | |
|---|---|---|---|---|
| 8,076,910 B2 * | 12/2011 | Bickel | ...................... | G05F 1/70 |
| | | | | 323/205 |
| 8,749,207 B2 | 6/2014 | Huomo | | |
| 8,749,297 B2 * | 6/2014 | Sutandi | ................ | H03K 17/102 |
| | | | | 327/436 |

(Continued)

FOREIGN PATENT DOCUMENTS

| | | |
|---|---|---|
| CN | 201528204 U | 7/2010 |
| CN | 103715698 A | 4/2014 |

(Continued)

OTHER PUBLICATIONS

Schneider Electric, PowerLogic™ PM5300 Series Power and Energy Meter User Guide (May 2015). (Year: 2015).*

(Continued)

*Primary Examiner* — Tung X Nguyen
*Assistant Examiner* — Robert P Alejnikov, Jr.
(74) *Attorney, Agent, or Firm* — K&L Gates LLP

(57) ABSTRACT

The present disclosure relates to a device of monitoring a reactive power compensation system to compensate reactive power, the device including a measurement unit configured to acquire voltage data, current data, and a phase angle from each constituent device, a power performance index calculation unit configured to calculate power performance index data including at least one of power factor data, flicker data, and harmonics data based on the acquired voltage data, current data, and phase angle, and a controller configured to analyze and evaluate the calculated power performance index data based on a preset situation.

9 Claims, 3 Drawing Sheets

(56) References Cited

U.S. PATENT DOCUMENTS

| | | | | |
|---|---|---|---|---|
| 2011/0264299 | A1* | 10/2011 | Mazzoli | H02J 3/01 |
| | | | | 700/298 |
| 2014/0177668 | A1* | 6/2014 | Aho | H02J 3/1821 |
| | | | | 373/104 |
| 2017/0331288 | A1* | 11/2017 | Perchais | H02J 3/18 |

FOREIGN PATENT DOCUMENTS

| | | |
|---|---|---|
| CN | 105449686 A | 3/2016 |
| FR | 3028681 | 11/2014 |
| JP | S56058742 A | 5/1981 |
| JP | H0433114 A | 2/1992 |
| JP | H0675647 A | 3/1994 |
| JP | H1164411 A | 3/1999 |
| JP | 2000222053 A | 8/2000 |
| JP | 2009225583 A | 10/2009 |
| JP | 2012039818 A | 2/2012 |
| JP | 2012125143 A | 6/2012 |
| JP | 2012239244 A | 12/2012 |
| JP | 5127608 B2 | 1/2013 |
| JP | 2013518347 A | 5/2013 |
| JP | 2014079156 A | 5/2014 |
| JP | 5957397 B2 | 7/2016 |
| KR | 101311992 B1 | 10/2013 |
| KR | 1020130117998 A | 10/2013 |
| KR | 101437350 B1 | 9/2014 |
| KR | 1020160001977 A | 1/2016 |
| WO | 2011/091441 A1 | 7/2011 |
| WO | 2011091444 A1 | 7/2011 |

OTHER PUBLICATIONS

Japanese Office Action for related Japanese Application No. 2017-102879; action dated Aug. 7, 2018; (5 pages).

European Search Report for related European Application No. 17172178.0; report dated Nov. 7, 2017; (7 pages).

Anonymous: PowerLogic PM5000 Series Technical Datasheet Basic Multi-Function Meters; Jan. 1, 2013; retrieved on Oct. 25, 2017; http://docs-europe.electrocomponents.com/webdocs/1372/0900766b81372111.pdf; (7 pages).

* cited by examiner

DEVICE OF MONITORING REACTIVE POWER COMPENSATION SYSTEM, AND METHOD THEREOF

CROSS-REFERENCE TO RELATED APPLICATIONS

This application claims the priority of Korean Patent Application No. 10-2016-0084340 filed on Jul. 4, 2016, in the Korean Intellectual Property Office, the disclosure of which is hereby incorporated by reference in its entirety.

BACKGROUND

1. Technical Field

The present disclosure relates to a device of monitoring a reactive power compensation system, and a method thereof.

2. Description of the Related Art

When power is supplied to a receiving end connected to a load, the power is not all used by the load. In other words, the power is not all used as active power by the load and part of the power is lost as reactive power, not contributing to a real work.

To minimize or compensate the reactive power, a reactive power compensation system is employed.

The reactive power compensation system adjusts a phase of a voltage or a phase of current and thus the reactive power may be minimized.

However, in a conventional reactive power compensation system, the quality of power is not monitored and thus a performance index of a system may not be known. Thus, it is a problem that system performance improvement and system maintenance and repair may not be performed with respect to a next system.

SUMMARY

It is an object of the present disclosure to address the above-described problems and other problems.

It is another object of the present disclosure to provide a device of monitoring a reactive power compensation system, which is capable of evaluating system performance by continuously monitoring a system performance index and used to improve performance of a next system based on the performance evaluation, and a method thereof.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, there is provided a device of monitoring a reactive power compensation system to compensate reactive power, which includes a measurement unit configured to acquire voltage data, current data, and a phase angle from each constituent device, a power performance index calculation unit configured to calculate power performance index data including at least one of power factor data, flicker data, and harmonics data based on the acquired voltage data, current data, and phase angle, and a controller configured to analyze and evaluate the calculated power performance index data based on a preset situation.

In accordance with one aspect of the present disclosure, there is provided a method of monitoring a reactive power compensation system, which includes acquiring voltage data, current data, and a phase angle from each constituent device, calculating power performance index data including at least one of power factor data, flicker data, and harmonics data based on the acquired voltage data, current data, and phase angle, and analyzing and evaluating the calculated power performance index data based on a preset situation.

DETAILED DESCRIPTION

Figure 1:
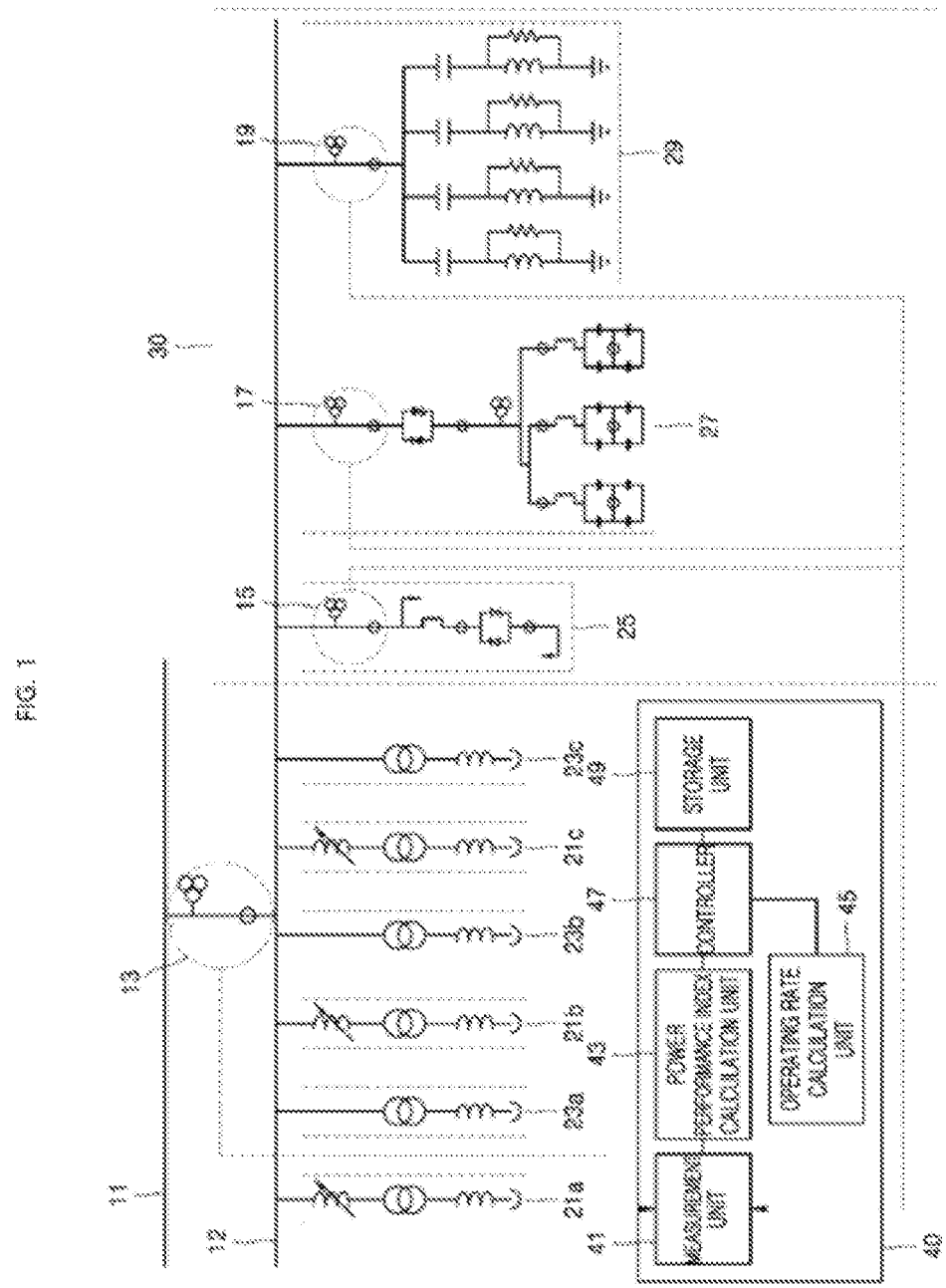
FIG. 1 illustrates a device of monitoring a reactive power compensation system according to an embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

As the inventive concept allows for various changes and numerous embodiments, particular embodiments will be illustrated in the drawings and described in detail in the written description, wherein like reference numerals in the drawings denote like elements, and thus their description will not be repeated. The suffix "module" and "unit" for components, which are used in the description below, are assigned and mixed in consideration of only the easiness in writing the specification. That is, the suffix itself does not have different meanings or roles. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the description of the present inventive concept, certain detailed explanations of related art are omitted when it is deemed that they may unnecessarily obscure the essence of the inventive concept.

FIG. 1 illustrates a device of monitoring a reactive power compensation system according to an embodiment of the present disclosure.

Referring to FIG. 1, the device of monitoring a reactive power compensation system according to the present embodiment may include a reactive power compensation unit 30 and a control system 40.

A plurality of loads 21a, 21b, 21c, 23a, 23b, and 23c may be connected to a receiving end 11. In detail, a branch line 12 may be branched from the receiving end 11, and the loads 21a, 21b, 21c, 23a, 23b, and 23c may be connected to the branch line 12.

Although FIG. 1 illustrates that the branch line 12 is connected to the receiving end 11, the loads 21a, 21b, 21c, 23a, 23b, and 23c may be directly connected to the receiving end 11 without the branch line 12.

The loads 21a, 21b, 21c, 23a, 23b, and 23c may be connected to a system other than the receiving end 11. The system may be an AC system, a DC system, or a HVDC system. However, the present disclosure is not limited thereto.

The loads 21a, 21b, 21c, 23a, 23b, and 23c may be loads provided in ironworks, for example, arc furnaces 21a, 21b, and 21c or smelting furnaces 23a, 23b, and 23c. However, the present disclosure is not limited thereto.

The reactive power compensation unit 30 may be connected parallel to the loads 21a, 21b, 21c, 23a, 23b, and 23c and commonly with the loads 21a, 21b, 21c, 23a, 23b, and 23c to the branch line 12 or the receiving end 11, but the present disclosure is not limited thereto. Accordingly, power supplied to the receiving end 11 may be supplied not only to the loads 21a, 21b, 21c, 23a, 23b, and 23c, but also to the reactive power compensation unit 30.

Figure 2:
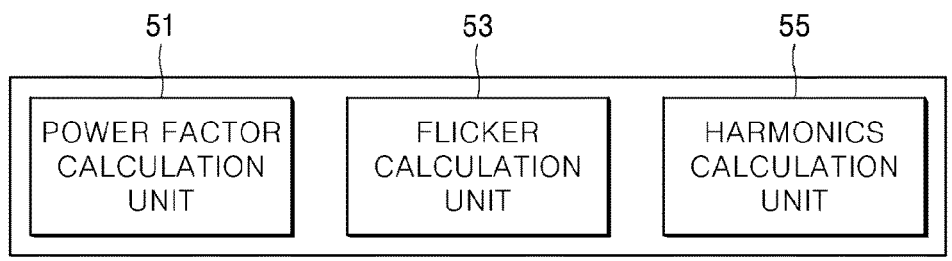
FIG. 2 is a block diagram of a detailed configuration of a power performance index calculation unit of FIG. 1.

The reactive power compensation unit 30, as illustrated in FIG. 2, may include a Thyristor-controlled reactor (TCR) 25, a Thyristor-switched capacitor (TSC) 27, and a harmonic filter unit 29.

The TCR 25 may include a reactor and a thyristor switch. The number or arrangement of reactors may be implemented by various methods.

The TSC 27 may include a capacitor and a thyristor switch. The number or arrangement of capacitors may be implemented by various methods.

The harmonic filter unit 29 may include a plurality of filters. Each filter may include a resistor, a capacitor, and an inductor. Although the resistor and the inductor may be connected in parallel, but the present disclosure is not limited thereto.

Both the TCR 25 and the TSC 27 may not be necessarily provided. Only one of the TCR 25 and the TSC 27 may be provided, but the present disclosure is not limited thereto.

For example, the TSC 27 may be mainly used to compensate reactive power for power factor improvement, and the TCR 27 may be mainly used to compensate reactive power for flicker improvement.

The power factor may be a ratio of active power and apparent power. The apparent power is power supplied to the receiving end 11. The active power may be a portion of the apparent power exclusive of the reactive power. Accordingly, as the power factor is improved, the active power increases and thus power loss is reduced and power may be efficiently used.

Although not illustrated, a fixed compensation unit may be further provided in addition to the TCR 25 or the TSC 27. The fixed compensation unit may be a fixed capacitor.

As the TCR 27 and/or the TSC 27 are controlled under the control of the control system 40, the reactive power compensation unit 30 may compensate the reactive power like the power factor improvement or the flicker improvement. For example, as a thyristor switch provided at the TCR 27 and/or the TSC 27 is switch controlled in response to a control signal provide by the control system 40, the reactive power may be compensated.

Although not illustrated, as long as a corresponding system operates, the reactive power compensation system according to the present disclosure may always compensate the reactive power such as the power factor, the flicker, and/or a harmonic distortion factor during the operation of the loads 21a, 21b, 21c, 23a, 23b, and 23c.

In a conventional reactive power compensation system, while the reactive power is simply compensated, the performance of the reactive power compensation system performing the compensation is not evaluated.

According to the present disclosure, by continuously monitoring the reactive power compensation of the reactive power compensation system, the performance of the reactive power compensation system may be evaluated and thus a next system may be designed based on the evaluation so as to have improved performance.

As described above, the device of monitoring a reactive power compensation system according to the present disclosure may include the control system 40.

The control system 40 may include a measurement unit 41, a power performance index calculation unit 43, an operating rate calculation unit 45, a controller 47, and a storage unit 49.

The measurement unit 41 may measure voltage data, current data, and a phase angle.

For example, the voltage data and the current data may be measured based on the voltage and current detected by first to fourth detectors 13, 15, 17, and 19.

For example, the phase angle may be calculated based on the phase of a voltage and the phase of current detected by the first to fourth detectors 13, 15, 17, and 19. For example, the phase angle may be calculated based on the phase of a voltage and the phase of current. For example, when a phase of current is ahead of a phase of a voltage, it may be referred to as leading, and when a phase of a voltage is ahead of a phase of current, it may be referred to as lagging. For example, when a phase angle in leading is expressed by a positive phase angle, a phase angle in lagging may be expressed by a negative phase angle.

Although not illustrated, other detectors are provided in constituent devices other than the portion where the first to fourth detectors 13, 15, 17, and 19 are provided, the voltage, the phase of a voltage, the current, and the phase of current may be detected.

The power performance index calculation unit 43 may calculate power performance index data based on the voltage data and the current data calculated by the measurement unit 41 under a preset situation.

The preset situation may signify an operating state of the reactive power compensation unit 30. The reactive power compensation unit may perform any one operation of the power factor compensation or the flicker compensation.

The power factor data, the flicker data, and the harmonics data may be used as the power performance index data, but the present disclosure is not limited thereto.

As illustrated in FIG. 2, the power performance index calculation unit 43 may include a power factor calculation unit 51, a flicker calculation unit 53, and a harmonics calculation unit 55.

The power factor calculation unit 51 may continuously and cumulatively calculate the power factor data.

The power factor may be calculated as a ratio of active power/apparent power with respect to a cumulative time. The power factor may be repeatedly and cumulatively calculated during a system operation.

To this end, active power may be calculated based on the voltage data, the current data, and the phase angle measured by the measurement unit 41. Accordingly, the power factor data may be calculated by dividing the active power by the apparent power supplied to the receiving end 11.

The flicker calculation unit 53 may calculate flicker data according to at least one of ΔV10, a long-term flicker Plt, and a short-term flicker Pst according to a monitoring cycle. A monitoring time for each of ΔV10, Plt, and Pst may be individually set. In the case of ΔV10, voltage fluctuation typically for one hour is converted by a size of 10 Hz and thus the size of flicker or the frequency of occurrences of flickers may be calculated.

In the case of Plt, a time longer than Pst, for example, one hour or less, is set and thus the size of flicker or the frequency of occurrences of flickers may be calculated during the set time.

In the case of Pst, a time shorter than Plt, for example, ten minutes, is set and thus the size of flicker or the frequency of occurrences of flickers may be calculated during the set time.

The flicker calculation unit 53 may repeatedly and cumulatively calculate the size of flicker according to each of ΔV10, Plt, and Pst during the system operation.

The harmonics calculation unit 55 may calculate total harmonics distortion THD or total demand distortion TDD.

The total harmonics distortion THD and the total demand distortion TDD are a kind of a harmonics distortion factor. The harmonics distortion factor may indicate a degree of distortion of a harmonics value V2, or V3, other than a fundamental wave voltage V1.

The total harmonics distortion THD and the total demand distortion TDD may be calculated based on the voltage data measured by the measurement unit 41.

The total harmonics distortion THD or the total demand distortion TDD may be calculated cumulatively for a certain period, for example, a one-hour period and thus an average value and a maximum value may be calculated, but the present disclosure is not limited thereto.

Various pieces of data, that is, the power factor data, the flicker data, and the harmonics data, which are calculated by the power performance index calculation unit 43, may be provided to the controller 47. The power factor data, the flicker data, and the harmonics data may be stored in the storage unit 49.

The controller 47 may analyze and evaluate the power factor data, the flicker data, and the harmonics data provided by the power performance index calculation unit 43.

The controller 47 may analyze correlation among the power factor data, the flicker data, and the harmonics data and output determination data about whether these pieces of data satisfy respective target values. The target value may be a value demanded by a customer or a regulation value set by a government for regulation.

The controller 47 may evaluate, through the correlation analysis, power factor and/or harmonics performance during the flicker compensation, or flicker and/or harmonics performance during the power factor compensation. In other words, whether power factor has been improved or harmonic distortion factor has been reduced during the flicker compensation may be evaluated.

In addition, whether the power factor data that have been cumulatively calculated for a given time satisfies a target value of the power factor is determined, and the determination data may be stored in the storage unit 49. Power factor related performance of the reactive power compensation system may be evaluated based on a result of the determination. For example, when the power factor data cumulatively calculated for a given time satisfies the target value of the power factor, the power factor related performance of the reactive power compensation system may be evaluated to be excellent.

The controller 47 may calculate differences between the power factor data, the flicker data, and the harmonics data, and the respective target values thereof, and may evaluate the power factor related performance, the flicker related performance, and the harmonics related performance of the reactive power compensation system, based on the differences.

For example, when the average value of the power factor data accumulated by being continuously monitored is the same as a power factor average target value or approaches the power factor average target value, the power factor related performance of the reactive power compensation system may be evaluated to be excellent.

In the present disclosure, a system operating status may be evaluated through an operating rate by monitoring the operating rate.

To this end, the operating rate calculation unit 45 may calculate an operating rate based on data about available states collected for each constituent device during the operation of the system.

The operating rate may be expressed by Equation 1.

Operating Rate=((Operation Available Time−Failure Stop Time)/Operation Available Time)*100  [Equation 1]

The operation available time may signify the operation available time exclusive of a plan stop time.

The plan stop time may signify a time planned for maintenance and repair and a regular inspection time.

The failure stop time may signify a time for which the system does not operate due to an unexpected failure or disorder.

The operating time calculated by the operating rate calculation unit 45 may be provided to the controller 47.

The controller 47 may analyze the operating rate calculated by the operating rate calculation unit 45 for a cumulative operating time and may evaluate the operating rate.

The cumulative operating time may be set to be a fixed time, for example, a cumulative operating time, a one-year cycle, a given lifespan, for example, a five-year lifespan of the system.

For example, the controller 47 may analyze a difference between a target operating rate and an actual operating rate for the set time, for example, one year, and may evaluate the operating rate.

For example, the controller 47 may analyze a difference between the plan stop time and an actual maintenance and repair time for a set time and change or manage the maintenance and repair time. When a failure stop occurs, the failure stop time is reflected to a relevant operating rate so as to increase the operating rate. The number of related failure stops or the failure state may be stored in the storage unit 49.

The storage unit 49 may store various pieces of data acquired by an evaluation apparatus of the reactive power compensation system.

For example, the storage unit 49 may store the power factor data, the flicker data, the harmonics data, and/or the operating rate measured by the measurement unit 41.

For example, the storage unit 49 may store the number of failure stops or the failure state.

For example, the storage unit 49 may store operating and stop related data, maintenance and repair data, or details of failure.

For example, the storage unit 49 may store analysis data and/or evaluation data analyzed or evaluated by the controller 47.

According to the present disclosure, the performance evaluation may be performed by continuously monitoring the power performance index data according to the operating state of the reactive power compensation unit 30, and by analyzing cumulative data.

According to the present disclosure, as the above performance evaluation data is continuously updated, the updated data may be reflected in the design of a next system.

According to the present disclosure, data about a degree of mutual influence may be accumulated through correlation analysis of the respective performance indexes.

According to the present disclosure, the analysis and evaluation of the operating rate according to the time are updated and thus the updated data may be reflected in the design of a next system.

According to the present disclosure, a failure handling time or a regular maintenance and repair time may be easily identified according to the calculation of the operating rate, and an accurate maintenance and repair time or an accurate failure handling time may be managed and reflected.

Figure 3:
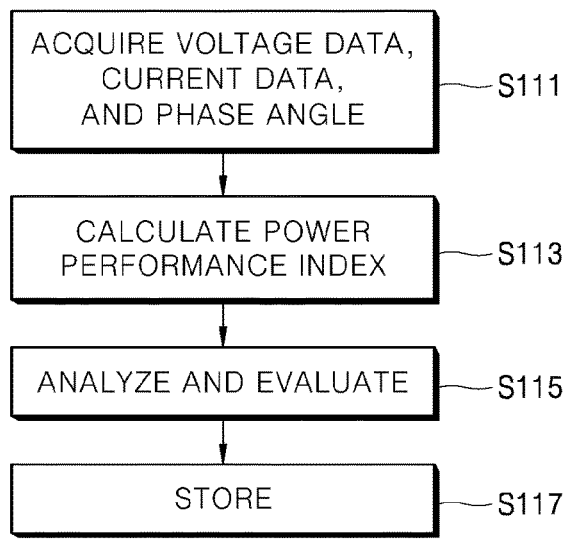
FIG. 3 is a flowchart of a method of monitoring a reactive power compensation system according to an embodiment of the present disclosure.

FIG. 3 is a flowchart of a method of monitoring a reactive power compensation system according to an embodiment of the present disclosure.

Referring to FIGS. 1 to 3, the measurement unit 41 may acquire voltage data, current data, and a phase angle (S111).

The voltage data, the current data, and the phase angle may be acquired based on the voltage, the phase of a voltage, the current, and the phase of current detected by the first to fourth detectors 13, 15, 17, and 19.

The power performance index calculation unit 43 may calculate a power performance index, for example, power factor data, flicker data, and/or harmonics data based on the voltage data, the current data, and the phase angle (S113).

Active power may be calculated based on the voltage data, the current data, and the phase angle, and power factor data may be calculated by dividing the active power by apparent power supplied to the receiving end 11.

The flicker data may be calculated according to at least one of ΔV10, long-term flicker (Plt), and short-term flicker (Pst).

At least one of the total harmonics distortion THD and the total demand distortion TDD may be calculated as harmonics data.

The controller 47 may analyze and evaluate a power factor, flicker, and/or a harmonics distortion factor for a given time based on the above-calculated power factor data, flicker data, and harmonics data (S115).

Evaluation related to various performance indexes may be performed.

For example, correlation among the power factor data, the flicker data, and the harmonics data may be analyzed. The power factor and/or the harmonics performance during flicker compensation may be evaluated through the correction analysis or the flicker and/or the harmonics performance during the power factor compensation may be evaluated.

For example, the power factor related performance, flicker related performance, and harmonics related performance of the reactive power compensation system may be evaluated through the differences between the power factor data, the flicker data, and the harmonics data, and the respective target values thereof.

The controller 47 may store relevant data acquired through the analysis and evaluation in the storage unit 49 (S117).

The relevant data stored in the storage unit 49 may include the voltage data, the current data, and the phase angle acquired by the measurement unit 41.

The relevant data stored in the storage unit 49 may include the correlation data among the power factor data, the flicker data, and the harmonics data.

The relevant data stored in the storage unit 49 may include power factor analysis data, flicker analysis data, and harmonics analysis data, which are acquired through the analysis.

The relevant data stored in the storage unit 49 may include power factor evaluation data, flicker evaluation data, and harmonics evaluation data, which are acquired through the evaluation.

Figure 4:
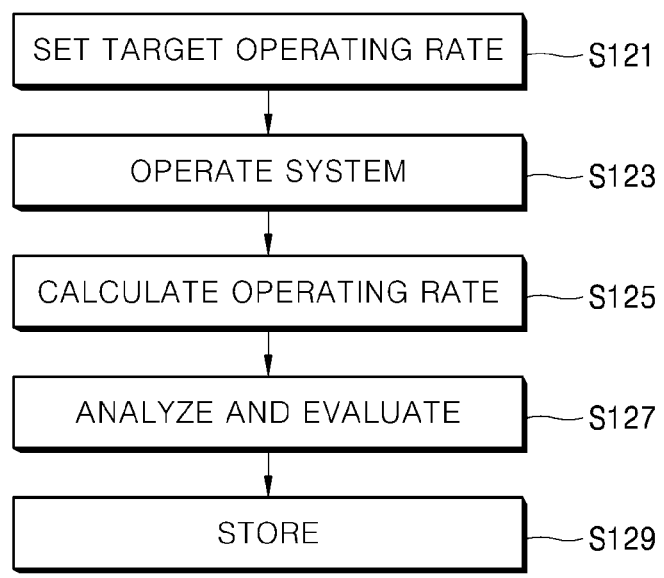
FIG. 4 is a flowchart of a method of monitoring a reactive power compensation system according to another embodiment of the present disclosure.

FIG. 4 is a flowchart of a method of monitoring a reactive power compensation system according to another embodiment of the present disclosure.

Referring to FIGS. 1, 2, and 4, a target operating rate may be set (S121).

The target operating rate may be performed by the control system 40. Although the target operating rate may be changed, the present disclosure is not limited thereto.

The reactive power compensation system may be operated (S123). The system may include not only the reactive power compensation system, but also the loads 21a, 21b, 21c, 23a, 23b, and 23c or other constituent devices, but the present disclosure is not limited thereto.

While a voltage is simultaneously applied to the loads 21a, 21b, 21c, 23a, 23b, and 23c as the system operates, relevant constituent devices are operated to apply the voltage to the loads 21a, 21b, 21c, 23a, 23b, and 23c. The reactive power generated before the application of a voltage to the loads 21a, 21b, 21c, 23a, 23b, and 23c or after the application of a voltage to the loads 21a, 21b, 21c, 23a, 23b, and 23c may be compensated by the reactive power compensation unit 30.

The operating rate calculation unit 45 may calculate an operating rate based on the data about available states collected for each constituent device during the operation of the system (S125).

The operating rate may be calculated by Equation 1 as described above.

The controller 47 may analyze and evaluate the operating rate based on the calculated operating rate (S127).

In detail, the controller 47 may analyze the operating rate calculated by the operating rate calculation unit 45 for a cumulative operating time, and evaluate the operating rate.

For example, the controller 47 may analyze a difference between the plan stop time and an actual maintenance and repair time for a set time and change or manage the maintenance and repair time. When a failure stop occurs, the failure stop time is reflected to a relevant operating rate so as to increase the operating rate.

The controller 47 may store the relevant data acquired through the analysis and evaluation in the storage unit 49 (S129).

For example, the number of failure stops or the failure state acquired related to the operating rate may be stored in the storage unit 49.

As described above, in the reactive power compensation system according to at least one of the above-described embodiments of the present disclosure, and the method thereof, the system performance evaluation may be possible by continuously monitoring a system performance index. The system performance evaluation may be used to improve the performance of a next system.

According to the present disclosure, since the performance evaluation data performed on the system is continuously updated, the updated data may be reflected in the design of a next system.

According to the present disclosure, the data related to a degree of mutual influence may be accumulated through the correlation analysis of the respective performance indexes.

According to the present disclosure, the analysis and evaluation of the operating rate according to the time are updated and thus the updated data may be reflected in the design of a next system.

According to the present disclosure, a failure handling time or a regular maintenance and repair time may be easily identified according to the calculation of the operating rate, and an accurate maintenance and repair time or an accurate failure handling time may be managed and reflected.

The present disclosure described above may be variously substituted, altered, and modified by those skilled in the art to which the present inventive concept pertains without departing from the scope and sprit of the present disclosure. Therefore, the present disclosure is not limited to the above-mentioned exemplary embodiments and the accompanying drawings.

What is claimed is:

1. A device for monitoring a reactive power compensation system to compensate reactive power, the device comprising:
    a measurement unit configured to acquire voltage data, current data, and a phase angle from a load, a Thyristor-controlled reactor, a Thyristor-switched capacitor, and a harmonic filter unit;
    a power performance index calculation unit configured to calculate power performance index data including power factor data, flicker data, and harmonics data based on the acquired voltage data, current data, and phase angle; and
    a controller configured to analyze and evaluate the calculated power performance index data based on a preset situation,
    wherein the controller is configured to calculate differences between the power factor data, the flicker data and the harmonics data, and the respective target values thereof, thereby determining power factor related performance, flicker related performance, and harmonics related performance of a reactive power compensation unit based on the differences, and
    wherein the preset situation is one of a power factor compensation operation state and a flicker compensation operation state of the reactive power compensation unit.

2. The device of claim 1, further comprising a storage unit that is configured to sore the analyzed and evaluated data.

3. The device of claim 1, wherein the harmonics data comprises at least one of total harmonics distortion (THD) and total demand distortion (TDD).

4. The device of claim 1, wherein the controller is configured to calculate differences between the flicker data, and the harmonics data, and the respective target values thereof, thereby determining the flicker related performance or the harmonics related performance based on the differences during power factor compensation.

5. The device of claim 1, wherein the controller is configured to calculate differences between the power factor data, and the harmonics data, and the respective target values thereof, thereby determining the power factor related performance or the harmonics related performance during flicker compensation.

6. The device of claim 1, further comprising an operating rate calculation unit that is configured to calculate an operating rate based on data about an available state collected for the load, the Thyristor-controlled reactor, the Thyristor-switched capacitor, and the harmonic filter unit,
    wherein the controller evaluates the operating rate by analyzing the calculated operating rate for a cumulative operating time, wherein the operating rate is expressed by the following equation:

$$\text{Operating Rate} = ((\text{Operation Available Time} - \text{Failure Stop Time})/\text{Operation Available Time})*100.$$

7. A method of monitoring a reactive power compensation system, the method comprising:
    acquiring voltage data, current data, and a phase angle from a load, a Thyristor-controlled reactor, a Thyristor-switched capacitor, and a harmonic filter unit;
    calculating power performance index data including at least one of power factor data, flicker data, and harmonics data based on the acquired voltage data, current data, and phase angle; and
    analyzing and evaluating the calculated power performance index data based on a preset situation,
    wherein the analyzing and evaluating of the calculated power performance index data based on the preset situation comprises calculating differences between the power factor data, the flicker data, and the harmonics data, and respective target values thereof, thereby determining power factor related performance, flicker related performance, and harmonics related performance based on the differences,
    wherein the preset situation is one of a power factor compensation operation state and a flicker compensation operation state of the reactive power compensation unit.

8. The method of claim 7, further comprising storing the analyzed and evaluated data.

9. The method of claim 7, further comprising:
    calculating an operating rate based on data about an available state collected for the load, the Thyristor-controlled reactor, the Thyristor-switched capacitor, and the harmonic filter unit, and
    evaluating the operating rate by analyzing the calculated operating rate for a cumulative operating time.

* * * * *